United States Patent [19]

Breuninger

[11] Patent Number: 4,983,959
[45] Date of Patent: Jan. 8, 1991

[54] LOGIC OUTPUT MACROCELL

[75] Inventor: Robert K. Breuninger, Garland, Tex.

[73] Assignee: Texas Instruments Incorporated, Dallas, Tex.

[21] Appl. No.: 266,238

[22] Filed: Oct. 28, 1988

Related U.S. Application Data

[63] Continuation of Ser. No. 914,201, Oct. 1, 1986, abandoned.

[51] Int. Cl.⁵ .............................................. H04Q 1/00
[52] U.S. Cl. ........................... 340/825.83; 340/825.79; 340/825.87; 307/465
[58] Field of Search ...................... 340/825.79, 825.83, 340/825.84, 825.87; 307/465, 440; 364/715, 716; 365/96

[56] References Cited

U.S. PATENT DOCUMENTS

| | | | |
|---|---|---|---|
| 3,566,153 | 2/1971 | Spencer, Jr. .................... | 340/825.83 |
| 4,032,894 | 6/1977 | Williams ......................... | 340/825.87 |
| 4,124,899 | 11/1978 | Birkner et al. ................... | 364/716 |
| 4,177,452 | 12/1979 | Balasubramanian et al. ...... | 307/468 |
| 4,286,173 | 8/1987 | Oka et al. ........................ | 307/465 |
| 4,422,072 | 12/1987 | Cavlan ............................. | 340/825.87 |
| 4,684,830 | 8/1987 | Tsui et al. ........................ | 364/716 |
| 4,717,912 | 1/1988 | Harvey et al. .................... | 340/825.83 |
| 4,771,285 | 9/1988 | Agrawal et al. ................... | 340/825.83 |

FOREIGN PATENT DOCUMENTS 2171546  8/1986  United Kingdom ................. 307/465

OTHER PUBLICATIONS

Baker et al, "The Palzoraio Story-The Customization of a Standard Product", IEEE Micro, Oct. 1986, pp. 45-60.

"PAL/PLE Programmable Logic Handbook", Fourth Edition, 1985, Monolithic Memories, Inc.

"Programmable Array Logic PALZORAIO", data sheet, 1985, Monolithic Memories.

Primary Examiner—Donald J. Yusko
Assistant Examiner—Edwin C. Holloway, III
Attorney, Agent, or Firm—Wade James Brady, III; Richard A. Bachand; Melvin Sharp

[57] ABSTRACT

A logic output macrocell (30) is programmable to select between a registered output (38a–n) or a nonregistered output (42a–n). The selection between the two outputs can be either reversible through coupling to a selecting output (58) of a combinatorial logic matrix (12) or it can be permanently programmed with the aid of an architectural fuse (52a–n).

25 Claims, 1 Drawing Sheet

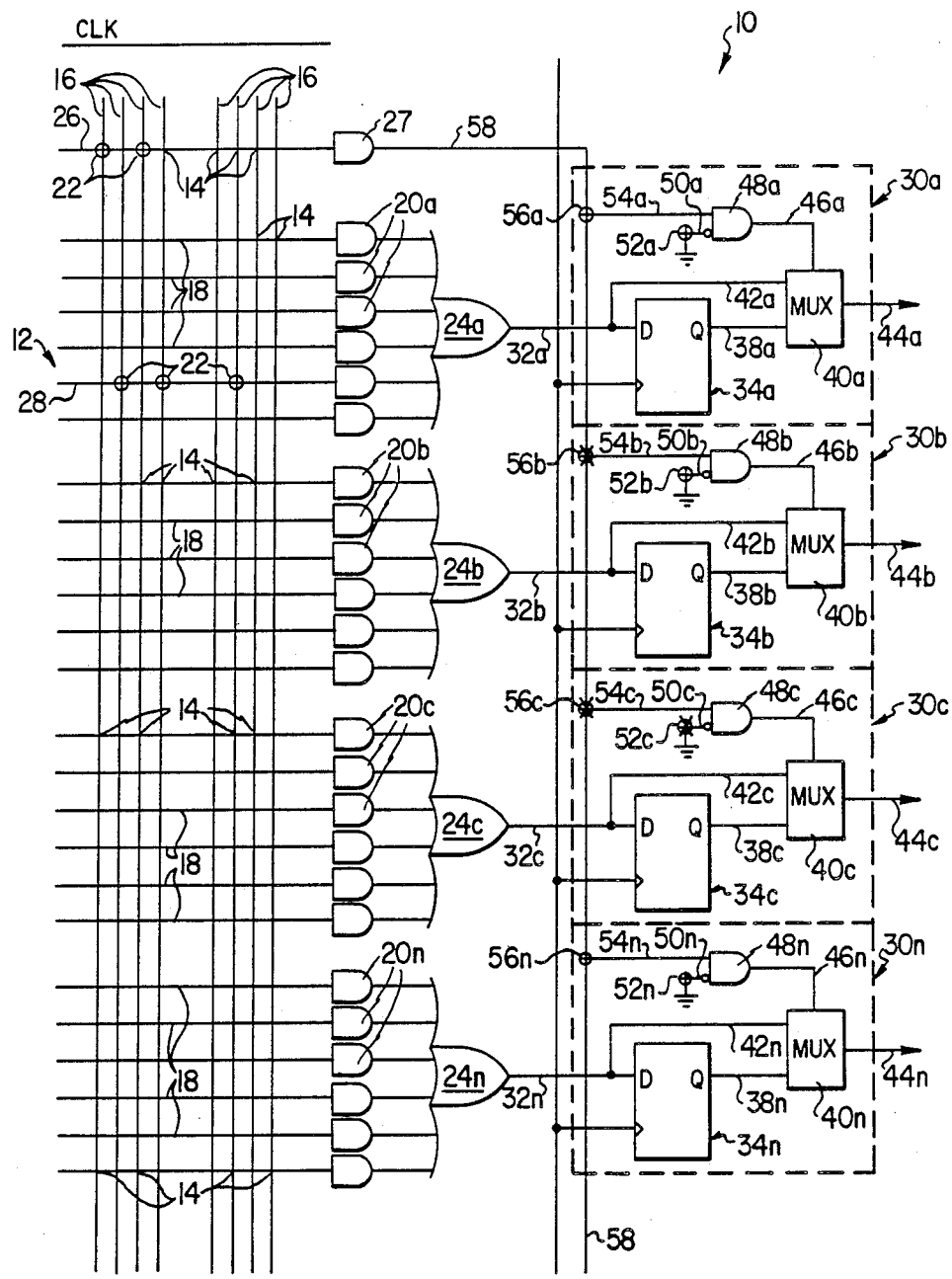

LOGIC OUTPUT MACROCELL

This application is a Continuation, of application Ser. No. 914,201, filed 10/01/86, now abandoned.

TECHNICAL FIELD OF THE INVENTION

This application relates in general to programmable logic arrays, and more particularly relates to logic arrays that can be programmed to select between registered and nonregistered output.

BACKGROUND OF THE INVENTION

Conventional programmable logic devices often have output registers in order to store the value of one or more output functions of their programmable logic matrices. Recently, multiplexers have been added to these output cells for selecting between a registered output, or an output from a respective output register, or an unregistered or combinatorial output directly from the logic matrix. Typically, these multiplexers are controlled by an architectural fuse that selects between registered and nonregistered outputs according to whether the fuse is blown or left intact. The programming for registered and nonregistered outputs is therefore permanent. Using conventional devices, therefore, the logic designer must resort to different output cells in order to have both registered and nonregistered outputs. This uses up output pins that would otherwise be available to output further combinatorial logic functions, and the device is less than optionally versatile as a result.

A need therefore exists for a programmable logic device having output cells that can be programmed to reversibly select between registered and nonregistered outputs.

SUMMARY OF THE INVENTION

Preferred embodiments of the present invention comprise an output cell for a combinatorial logic matrix that includes an output register for storing a combinatorial function value. The output register is coupled to a function output from the logic matrix, and has a registered output line. A selector selectively enables either this registered output line or an unregistered output line coupled directly to the combinatorial logic matrix for output to an output line of the cell.

This selector is coupled to a selecting matrix output of the combinatorial logic matrix. The selecting matrix output in turn is operable to be coupled to selected ones of a plurality of inputs of the combinatorial logic matrix. Therefore, a combinatorial logic function may be programmed into the matrix that allows for the reversible selection of either registered or unregistered output of the output cell.

In one embodiment, the selectors of the output cells are all selectively coupled to a selecting matrix output line of the combinatorial logic matrix through respective architectural fuses. By either blowing or leaving intact this architectural fuse, the type of output from each cell can be controlled either independently or through the value of a selecting combinatorial logic function appearing on the selecting output line.

In another embodiment of the invention, each output cell further includes a permanent selector that is programmable to permanently select between registered and nonregistered output The invention thus allows the designer to select between registered and nonregistered output by software programmed input into the logic matrix Since, for each output cell, a designer can reversibly select between registered and nonregistered output, further output cells need not be employed and a savings is had in the use of the limited number of output pins available for the device. The invention allows the designer greater flexibility, and allows the implementation of such functions as transparent latches

BRIEF DESCRIPTION OF THE DRAWING

A more complete understanding of the invention and its advantages may be had by reference to the following Detailed Description when taken in conjunction with the accompanying drawing wherein:

the FIGURE is a simplified schematic electrical diagram of a combinatorial logic device incorporating the invention.

DETAILED DESCRIPTION OF THE ILLUSTRATED EMBODIMENT

Referring now to the FIGURE, a combinatorial logic device is indicated generally at 10. Device 10 comprises a programmable logic matrix 12, such as a field programmable logic array. The particular matrix 12 illustrated is a sum-of-products array that uses a plurality of fuses 14 as its programmable elements. It should be understood that, in addition to the particular sum-of-products array 12 illustrated, the invention is equally applicable to a product-of-sums array, or a programmable array using EPROM (erasable programmable read only memory) elements in the place of fuses 14.

Matrix 12 has a plurality of inputs 16. Inputs 16 can comprise external inputs coupled to pins (not shown) of device 10, and can also comprise internal inputs resulting from feedback of various programmed function outputs. In matrix 12 unblown fuses are indicated by a small circle surrounding the intersection of an input 16 and a function product term 28; no surrounding circle indicates a blown fuse.

Input lines 16 intersect a plurality of function product term lines, here indicated schematically by lines 18. Each illustrated line 18 actually represents a bundle of product term lines that all feed into a particular AND gate 20a–n. In a "virgin" part, each input line 16 is connected via an unblown fuse 14 to each product term line 18. In order to program the device, all except selected ones of fuses 14 are blown, connecting the unselected input lines 18 to a high voltage level. The remaining intact fuses, such as are indicated at 22, thus control the output of the respective gate 20a–n with which they are coupled. When programmed, each illustrated line 18 comprises a product term circuit that embodies a product term of a combinatorial logic function.

In the illustrated sum-of-products matrix 12, groups of AND gates 20a–n have their outputs connected to a respective OR gate 24a–n. This provides summing function of the product terms output from each of AND gates 20a–n. Although in this exemplary embodiment six AND gates 20a–n are shown feeding into any one particular OR gate 24a–n, it should be understood that the number of AND gates 20 more generally ranges from 8 to 16, and can theorically be of any number. In general, the illustrated components of device 10 have been reduced in number for purposes of clarity.

A selecting product term circuit 26 is output to an AND gate 27, but the output of AND gate 27 is not coupled to an OR gate. By blowing or keeping intact fuses 14, selecting product term circuit 26 may be coupled to selected ones of inputs 16 in order to embody a programmed combinatorial function thereof. For purposes of clarity, only selecting product term circuit 26 and one function product term circuit 28 are shown to be programmed, it being understood that the rest of product term lines or circuits would be programmed in the same step as product term circuits 26 and 28.

Device 10 has a plurality of output macrocells 30a–n shown in the FIGURE by dotted lines. The structure of macrocell 30a will be described in particular, it being understood that macrocells 30b–n each have a structure similar to macrocell 30a. Macrocell 30a receives at least one output 32a from a respective OR gate 24a. Output line 32a, which carries a signal representing the value of a combinatorial function produced by respective gates 20a and 24a, is fed into an output register 34a. The shown register 34a is a synchronous D-Q flip flop that is clocked by a clock line 36. D-Q output register 34a has only one function input that is coupled to matrix function output 32a. In alternate embodiments, D-Q flop flop 34a can be replaced by a J-K flip flop or an S-R flip flop. In these last two embodiments, two or more function output lines 32a would feed into register 34a. For example, one output line 32a would feed into the "S" input of an S-R flip flop output register, and another function output line 32a would feed into the "R" input of an S-R flip flop register.

Output register 34a has at least one registered output line 38a that is coupled to a respective multiplexer 40a. Many registers suitable for functioning as output register 34a have a Q output and Q inverse output, both of which would then be connected to multiplexer 40a or its equivalent.

Function output line 32a is further directly connected via a nonregistered-output line 42a to multiplexer 40a. Multiplexer 40a thus has presented to it a registered output line 38a, and a nonregistered or combinatorial output line 42a. Multiplexer 40a has as its output a macrocell output line 44a, which can be fed back and coupled to one of input lines 16, or be connected to an external output pin, or both. Multiplexer 40a acts to select which of outputs 38a or 42a will appear on macrocell output line 44a.

Multiplexer 40a further has a selector line 46a. The value on a selector line 46a will determine whether nonregistered output line 42a or registered output line 38a is coupled to a cell output line 44a. In the illustrated embodiment, selector line 46a is connected to the output of an AND gate 48a is a selecting output gate and. Each AND gate 48a has a plurality of inputs including a first input 50a which is inverted and connected to an architectural fuse 52a. A second input 54a of AND gate 48a is connected via an architectural fuse 56a to a matrix selecting output line 58. Selecting output line 58 is in turn coupled to selecting product term line 26 by AND gate 27. As illustrated, selecting output line 58 is operable to control the type of output for each of cells 30a–n. In an alternative embodiment, each cell 30a–n could be coupled to an individual selecting output line, which would in turn be coupled to a separate selecting product term circuit like circuit 26. In macrocells 30a-30 unblown architectural fuses, e.g., 50a are indicated by a circle surrounding a connection between two lines segments; a blown architectural fuse is indicated by an "X" through the circle, e.g. 56b.

Although only four output registers 34a–n are shown, it should be understood that this is a simplification and that a greater number of output registers 34a–n are more usually employed.

In operation, each macrocell 30a–n can be selectively programmed to either reversibly select registered or nonregistered output or irreversibly select registered or nonregistered output. Cell 30a illustrates programming for a reversible selection between registered and nonregistered output. Architectural fuse 56a is left intact, thus coupling selecting output line 58 to line 54a. A combinatorial logic function is programmed into product term circuit 26 by selectively blowing or keeping intact fuses 14. Fuse 52a is also kept intact, such that a "zero" level will be generated and will be inverted to appear as a "one" level on input 50a of AND gate 48a. In this manner, the value of a combinatorial logic function output on line 58 can control the output 46a from AND gate 48a, and thus will control whether nonregistered output line 42a or registered output line 38a is selected. Macrocell 30n is similarly programmed.

Macrocells 30b and 30c illustrate programming to effect a permanent selection between nonregistered and registered output. In cell 30b, fuse 56b is blown, isolating macrocell 30b from matrix selecting line 58. Line 54b is thereby pulled up to a high value. Fuse 52b is left intact, permanently selecting registered output on line 38b.

In macrocell 30c, line 58 is decoupled by blowing fuse 56c. Fuse 52c is also blown, permanently selecting nonregistered output line 42c for connection to cell output line 44c.

As shown, the designer can treat each macrocell 30a–n differently, and may irreversibly program certain of macrocells 30a–n for registered or unregistered output, and may program others for reversible output selection. The disclosed architecture allows the designer to emulate a transparent latch by allowing a function output to immediately appear on a cell output line 44a–n by selection of an appropriate nonregistered output line 42a–n.

In summary, a programmable macrocell has been disclosed that allows the designer to either make a permanent or reversible selection of registered or nonregistered output. The macrocell of the invention may be configured such that the value of a combinatorial logic function controls whether registered output from an output register appears on a macrocell output, or whether nonregistered output directly from the combinatorial logic matrix appears there instead. Alternately, the macrocell of the invention can be programmed to permanently select between nonregistered and registered output.

ADVANTAGES OF THE INVENTION

A principal advantage of the invention is the provision of a logic output macrocell that allows either permanent or nonpermanent selection of registered or nonregistered outputs. Another advantage of the invention is the selection of registered or nonregistered output of the macrocell by the use of a combinatorial logic function programmed into a logic matrix. Another advantage of the invention is the provision of a permanent means for programming the macrocell, such that, at the designer's option, registered or nonregistered output can be permanently selected. Another advantage of the invention is the provision of at least one selecting output line from the combinatorial logic matrix that controls one or more output registers which can be selectively coupled to the selecting output line. Thus, certain of the output registers can be reversibly programmed to select either registered or nonregistered output, and others of the output registers can be irreversibly programmed.

Although a preferred embodiment of the invention and advantages thereof have been illustrated with the aid of the accompanying drawing and described it will be understood that the invention is not limited to the illustrated embodiment but is capable of numerous rearrangements, modifications and substitutions without departing from the spirit and the scope of the invention as defined by the appended claims.

What is claimed is:

1. A combinatorial logic device comprising:
   a combinatorial logic matrix having a nonregistered output and a selecting output;
   a register receiving said nonregistered output and generating a registered output;
   a selector independent from said register and having an external output for selecting either said registered output or said nonregistered output for coupling to said external output responsive to said selecting output;
   wherein said selector includes an element for permanently selecting between said registered and said nonregistered outputs.

2. The combinatorial logic device of claim 1, wherein said combinatorial logic matrix further has a plurality of inputs, said matrix having circuitry embodying a combinatorial logic functions of selected ones of said inputs, said circuitry coupled to said selected output, such that said registered or said unregistered output is selected according to the value of said function.

3. An output cell in combination with a combinatorial logic matrix comprising:
   a combinatorial logic matrix;
   an output register for storing a combinatorial function value, said output register having a function input and a registered output;
   a function output from the combinatorial logic matrix coupled to said function input of said output register;
   a selector independent from said output register and coupled to said function output and said registered output and having a cell output, said selector selectively coupling either said function output or said registered output to said cell output; and
   a selecting output from the combination logic matrix and coupled to said selector, said selecting output for selecting either said function output or said registered output for coupling to said cell output;
   and further comprising a decoupling member for decoupling said selecting output from said selector.

4. The output cell of claim 3, wherein said selector comprises a multiplex receiving said function output and said registered output and coupled to said cell output, said multiplexer coupled to a selecting output gate by a selector line, said output gate having an input thereon coupled to said selecting output from said combinatorial logic matrix and independent from said register.

5. The output cell of claim 4, wherein said selecting output gate comprises an AND gate, a second input of said AND gate coupled to an architectural fuse.

6. The output cell of claim 3, wherein said decoupling member comprises an architectural fuse.

7. The output of cell of claim 3, wherein the combinatorial logic matrix further comprises a product term circuit coupled to said selecting output, at least one input of said combinatorial logic matrix selectively coupled to said product term circuit to form a combinatorial logic function for controlling whether said registered output or said function output is selected.

8. An output cell for a combinatorial logic matrix, comprising:
   an output register for storing an output value generated by the matrix and having a registered output line;
   an unregistered output line coupled to the matrix;
   a cell output
   a permanent selector for permanently selectively coupling one of either said unregistered output line or said registered output line to said cell output; and
   a temporary selector independent from said output register for reversibly coupling either said unregistered output line or said registered output line to said cell output.

9. The output cell of claim 8, wherein said temporary selector comprises a multiplexer, a selecting output from said combinatorial logic matrix coupled to said multiplexer, a signal on said selecting output to temporarily select between said unregistered output line and said registered output line.

10. The output cell of claim 9, wherein a product term circuit is coupled to said selecting output and said product term circuit is selectively coupled to a plurality of logic matrix input lines.

11. The output cell of claim 8, wherein said permanent selector comprises an architectural fuse, a multiplexer coupled to said fuse and receiving as inputs said unregistered output line and said registered output line, said fuse for selecting between said registered output line and said unregistered output line by blowing or leaving intact said fuse.

12. The output cell of claim 11, and further comprising a selecting output gate having a plurality of inputs including a fuse line coupled to said architectural fuse, an output of said selecting output gate coupled to said multiplexer for selecting between said registered and said unregistered output line, a second input of said selecting output gate coupled to said temporary selector.

13. The output of claim 12 and further comprising a second architectural fuse to selectively couple said temporary selector to said second input.

14. A method for selecting between registered and nonregistered outputs from a combinatorial logic matrix, comprising the steps of:
   generating a registered output in response to a nonregistered output from the matrix;
   choosing the mode of operation of a selector which is selectively operable in either an alterable mode or unalterable mode of selecting either the nonregistered or the registered output;
   selecting either the nonregistered or the registered output with the selector operating in the chosen mode; and
   outputting the selected output.

15. The method of claim 14, and further including the step of generating a selecting output from the combinatorial logic matrix, the alterable mode of selecting being performed in response to the selecting output.

16. The method of claim 15, wherein the step of generating a selecting output further includes the steps of:
coupling selected ones of a plurality of inputs of the matrix to a selecting matrix output line; and
generating the selecting output as a combinatorial logic function of the inputs.

17. The method of claim 16, and further including the step of:
coupling selected ones of a plurality of output cells to the selecting output by selectively blowing or keeping intact an architectural fuse in each cell disposed between the selecting output and a selector of the cell.

18. The method of claim 16, and further including the steps of:
selectively disconnecting a plurality of output cells from the selecting output; and
permanently selecting between registered and non-registered output in each of the disconnected output cells by blowing or keeping intact an architectural fuse coupled to a selector of each disconnected cell.

19. A combinatorial logic device comprising:
a combinatorial logic matrix having a plurality of inputs and logic matrix outputs;
a plurality of output macrocells, each output microcell including an unregistered output line, a register having an input and a registered output line, a selecting means, and a cell output line, and unregistered output line and the input of the register coupled to a respective one of the logic matrix outputs, the selecting means coupled to the unregistered output line, the registered output line, and the cell output line for selectively permanently or reversibly selecting either the registered output line or the unregistered output line for coupling to the cell output line.

20. The combinatorial logic device of claim 19, and further comprising a selecting matrix output line coupled to selected inputs of the combinatorial logic matrix and selectively coupled to selected ones of the selecting means for reversibly selecting either the registered output line or the unregistered output line for coupling to the cell output line.

21. The combinatorial logic device of claim 20, wherein the selecting means includes a multiplexer having inputs coupled to the registered output line and the unregistered output line, the selecting matrix output line selectively coupled to the multiplexer for reversibly selecting either the registered output line or the unregistered output line for coupling to the cell output line.

22. The combinatorial logic device of claim 21, wherein each selecting means includes a permanent selector coupled to the multiplexer for permanently selecting either the registered output line or the unregistered output line for coupling to the cell output line.

23. The combinatorial logic device of claim 22, wherein the permanent selector includes an architectural fuse and a selecting output gate having an output coupled to the multiplexer, a first input coupled to the architectural fuse, and a second input coupled to the selecting matrix output line.

24. The combinatorial logic device of claim 20, wherein the selecting matrix output line is coupled to selected ones of the selecting means through respective architectural fuses, each of the architectural fuses having a first state for allowing the reversible selection of the registered output line or the unregistered output line by the selecting matrix output line and a second state for decoupling the selecting matrix output line from the selecting means.

25. The combinatorial logic device of claim 20, wherein the selecting matrix output line is coupled to a product term circuit of the combinatorial logic matrix, the product term circuit being coupled to selected ones of the inputs of the combinatorial logic matrix.

* * * * *